United States Patent
Akahane

(10) Patent No.: US 10,797,692 B2
(45) Date of Patent: Oct. 6, 2020

(54) INTEGRATED CIRCUIT DEVICE

(71) Applicant: FUJI ELECTRIC CO., LTD., Kawasaki-shi, Kanagawa (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/146,378

(22) Filed: Sep. 28, 2018

(65) Prior Publication Data

US 2019/0036525 A1   Jan. 31, 2019

Related U.S. Application Data

(63) Continuation of application No. PCT/JP2017/030348, filed on Aug. 24, 2017.

(30) Foreign Application Priority Data

Oct. 5, 2016  (JP) .................................. 2016-196820

(51) Int. Cl.
*H03K 17/22*  (2006.01)
*G06F 9/4401*  (2018.01)
(Continued)

(52) U.S. Cl.
CPC .......... *H03K 17/22* (2013.01); *G06F 9/4401* (2013.01); *G06F 13/38* (2013.01); *G06F 13/4269* (2013.01); *H03K 19/20* (2013.01)

(58) Field of Classification Search
CPC ............. G06F 11/3656; G06F 11/2236; G06F 31/31705
See application file for complete search history.

(56) References Cited

U.S. PATENT DOCUMENTS 5,179,696 A * 1/1993 Shouda ............... G06F 11/3636
                                                        714/25
5,935,266 A * 8/1999 Thurnhofer ...... G01R 31/31705
                                                        714/30
(Continued)

FOREIGN PATENT DOCUMENTS

JP            6138191 A    5/1994
JP       2003-273232 A    9/2003
(Continued)

OTHER PUBLICATIONS

International Search Report dated Oct. 10, 2017 in corresponding International Patent Application No. PCT/JP2017/030348.
(Continued)

*Primary Examiner* — Thomas J. Hiltunen

(57) ABSTRACT

An integrated circuit device includes a circuit device main body which is configured to execute a predetermined processing function, a communication control circuit which is configured to perform data communication with an external control device and an operation mode determination unit which is configured to selectively determine a normal mode for executing the processing function or a debug mode for setting an execution condition of the processing function as an operation mode of the circuit device main body. The operation mode determination circuit is configured to operate in accordance with an internal clock and to generate an operation mode output value for determining the operation mode of the circuit device main body according to a logical state of a particular one communication signal which is data-communicated with the external control device after a reset operation performed by a reset circuit is released.

22 Claims, 11 Drawing Sheets

(51) Int. Cl.
*H03K 19/20* (2006.01)
*G06F 13/38* (2006.01)
*G06F 13/42* (2006.01)

(56) References Cited

U.S. PATENT DOCUMENTS

| | | | | |
|---|---|---|---|---|
| 6,408,415 | B1* | 6/2002 | Kim | G01R 31/31701 |
| | | | | 714/738 |
| 6,839,654 | B2* | 1/2005 | Rollig | G06F 1/14 |
| | | | | 700/13 |
| 6,861,866 | B2* | 3/2005 | Han | G01R 31/31705 |
| | | | | 326/16 |
| 7,219,265 | B2* | 5/2007 | Yee | G06F 11/267 |
| | | | | 714/30 |
| 7,805,650 | B2* | 9/2010 | Sato | G06F 11/2236 |
| | | | | 714/39 |
| 8,161,328 | B1* | 4/2012 | Wilshire | G06F 11/2236 |
| | | | | 714/34 |
| 9,135,132 | B2* | 9/2015 | Han | G01R 31/31858 |
| 9,476,937 | B2* | 10/2016 | Sharda | G01R 31/31705 |
| 9,766,289 | B2* | 9/2017 | Parasrampuria | |
| | | | | G01R 31/318385 |
| 2005/0149892 | A1* | 7/2005 | Yee | G01R 31/31705 |
| | | | | 716/113 |
| 2008/0010541 | A1* | 1/2008 | Kudo | G06F 11/3656 |
| | | | | 714/38.13 |

FOREIGN PATENT DOCUMENTS

| | | |
|---|---|---|
| JP | 2006-194727 A | 7/2006 |
| JP | 2010140219 A | 6/2010 |
| JP | 2011-064470 A | 3/2011 |
| JP | 2015-142452 A | 8/2015 |

OTHER PUBLICATIONS

Written Opinion of the International Search Authority dated Oct. 10, 2017 in corresponding International Patent Application No. PCT/JP2017/030348.

Japanese Office Action dated Jan. 28, 2020, from Japanese Patent Application No. 2018-543772, 9 pages.

* cited by examiner

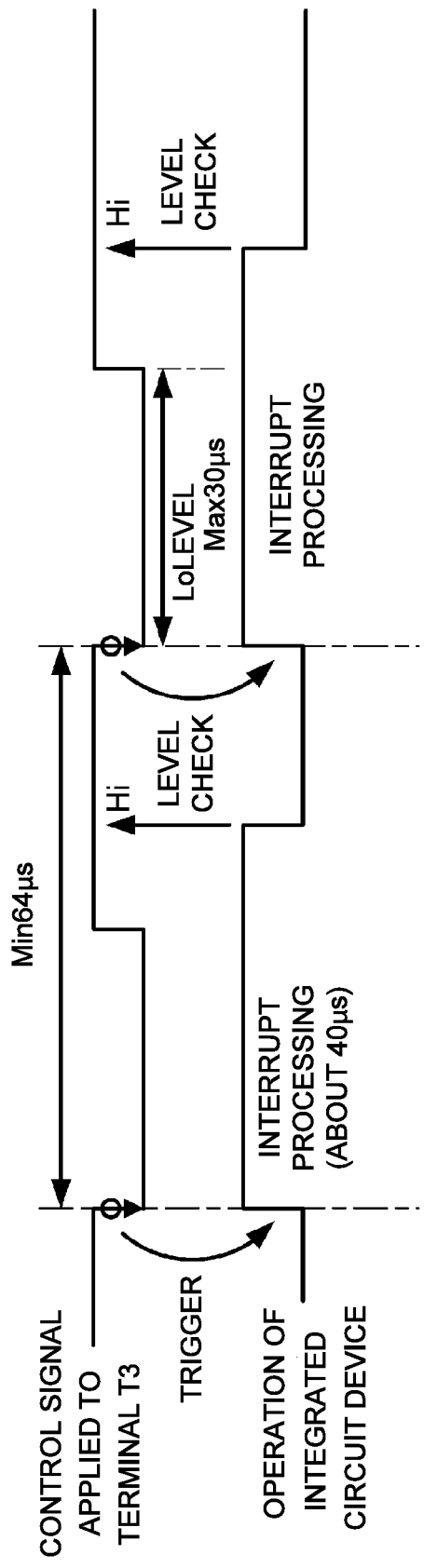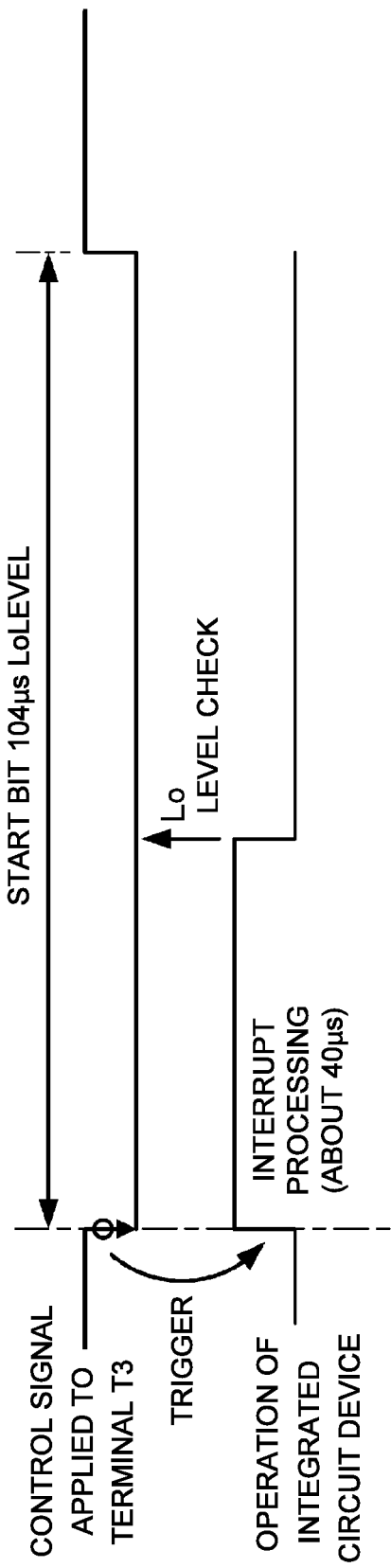

INTEGRATED CIRCUIT DEVICE

CROSS-REFERENCE TO RELATED APPLICATIONS

This application is a Continuation of PCT Application No. PCT/JP2017/030348 filed Aug. 24, 2017, which claims the benefit of Japanese Patent Application No. 2016-196820 filed Oct. 5, 2016. The disclosures of the prior applications are hereby incorporated by reference herein in their entireties.

TECHNICAL FIELD

The present invention relates to an integrated circuit device which has a simple configuration and can easily switch an operation mode of a circuit device main body from an external control device side.

BACKGROUND ART

Recently, various kinds of highly-functionalized integrated circuit devices called an Intelligent Power Module (IPM) have been developed as a control IC for a switching power supply, for example. This kind of integrated circuit device schematically includes a circuit device main body for executing a predetermined processing function and a communication control circuit for performing data communication with an external control device. The circuit device main body is configured to turn on/off power semiconductor switching elements in accordance with predetermined control information, for example. The communication control circuit transmits an operation state of the circuit device main body and various detection information to the control device or supplying control information, or the like, and to turn on/off the power semiconductor switching elements under an instruction from the control device to the circuit device main body.

Such data communication between the integrated circuit device and the control device is generally performed by means of serial communication synchronous with a communication clock as disclosed in, for example, JP-A-2011-64470. The integrated circuit device disclosed in JP-A-2011-64470 outputs a pulse signal, which is generated by the circuit device main body, to the outside from a plurality of communication terminals (ports) for data communication which are provided in the integrated circuit device. Further, the integrated circuit device receives a control signal as input from the control device via a communication terminal (port), sets the integrated circuit device to a parameter setting mode, and sets various kinds of parameters with respect to a processing function executed by the circuit device main body.

The serial communication is executed by setting the integrated circuit device to a serial communication mode. The outputting of the pulse signal to the outside is executed by setting the integrated circuit device to a pulse output mode. Shifting from the serial communication mode or the pulse output mode to the parameter setting mode is performed by setting the control signal, which is supplied to the particular communication terminal (port) of the integrated circuit device from the control device side, to an [L] level, and interrupting a processing operation of the circuit device main body in the integrated circuit device. Then, in the integrated circuit device, a logical state of the particular communication terminal after the predetermined interrupt processing is checked, and thus the shifting to the parameter setting mode is detected. Specifically, in the example disclosed in JP-A-2011-64470, a voltage of a terminal T3 of the integrated circuit device, which is used for a request from the integrated circuit device side but not used in the pulse output mode, is controlled from the control device side. The integrated circuit device shifts to the parameter setting mode in accordance with the voltage (logical state) of the terminal T3 after the predetermined interrupt processing.

However in the operation mode switching processing disclosed in JP-A-2011-64470 FIGS. 11A and 11B, the control signal to be applied to the terminal T3 is required to be controlled from the control device side in accordance with the operation mode at this time after the interrupt processing is performed on the integrated circuit device. Specifically, the control device is required to control the generation timing of the control signal so that the integrated circuit device can recognize the control signal (voltage) of the terminal T3 at the timing according to the operation mode at this time.

In other words, the control device is required to generate the control signal at the timing according to the operation mode of the integrated circuit device, whereas the integrated circuit device is required to detect the control signal at the timing according to the operation mode at this time. Thus, the control device is required to have a timer circuit for managing the generation timing of the control signal, and the integrated circuit device is required to have a timer circuit for managing the detection timing of the control signal. Accordingly, a circuit configuration of each of the control device and the integrated circuit device becomes larger in size.

The control signal generated from the control device is synchronous with the communication clock, whereas the detection of the control signal in the integrated circuit device is solely executed in synchronism with an internal clock in the integrated circuit device. Thus, in order to surely transmit the control signal to the integrated circuit device from the control device, it is necessary to provide a time margin in each of the generation timing of the control signal in the control device and the detection timing of the control signal in the integrated circuit device.

SUMMARY

The present invention has been made in view of the above circumstances, and an object thereof is to provide an integrated circuit device which has a simple configuration and can easily and effectively switch an operation mode of a circuit device main body to a normal mode or a debug mode by detecting, separately from a communication clock, a logical state of a communication signal of communication data which is communicated with a control device.

According to an embodiment of the present invention, there is provided an integrated circuit device including:

a circuit device main body which is configured to execute a predetermined processing function;

a communication control circuit which is configured to perform data communication with an external control device; and an operation mode determination circuit which is configured to selectively determine, as an operation mode of the circuit device main body, a normal mode for executing the processing function or a debug mode for setting an execution condition of the processing function.

The operation mode determination circuit in the integrated circuit device is configured to operate in accordance with an internal clock and to generate an operation mode output value for determining the operation mode of the circuit device main body according to a logical state of a particular one communication signal which is data-communicated with the external control device after a reset operation performed by a reset circuit is released.

The reset circuit may be configured to output a reset signal at a time of turning-on of a power supply and after a debug processing by the debug mode of the circuit device main body, so as to initialize the operation mode determination circuit. The "time of turning-on of the power supply" includes a time when the power supply is turned on again in response to turning-on/off of a power supply applying signal which is data-communicated with the external control device in the normal mode.

The particular one communication signal which is data-communicated with the external control device and used for determining the operation mode of the circuit device main body may be a communication clock supplied from the external control device. The operation mode determination circuit may be configured to generate the operation mode output value for determining the operation mode of the circuit device main body according to a logical state which is obtained as a voltage level of a receiving terminal of the communication clock after the release of the reset operation.

The operation mode determination circuit may include a reset-type flip-flop circuit which includes a flip-flop configured to operate in synchronism with the internal clock after the release of the reset operation and set the logical state of the particular one communication signal supplied to an input terminal thereof, and which is configured to feed back a logical output of the flip-flop to the input terminal in place of the particular one communication signal.

The operation mode determination circuit may further include a preset-type flip-flop circuit which includes a plurality of stages of flip-flops more than the reset-type flip-flop circuit, for example, a plurality of stages larger by one stage than the reset-type flip-flop circuit. The plurality of stages of flip-flops of the reset-type flip-flop circuit include a flip-flop of a first stage which is configured to operate in synchronism with the internal clock to be preset to a low level after the release of the reset operation, and a flip-flop of a succeeding stage which is configured to operate in synchronism with the internal clock and in which a logical output of the flip-flop of a preceding stage is set.

The operation mode determination circuit may further include an OR circuit which is configured to output a logical output of the preset-type flip-flop circuit or a logical output of the reset-type flip-flop circuit as the operation mode output value for determining the operation mode of the circuit device main body.

The operation mode determination circuit may be configured to set the normal mode by fixing a receiving terminal of the communication clock to a low level in a case where the normal mode of the circuit device main body is not accompanied by the data communication with the external control device and to fix the receiving terminal of the communication clock to a high level at the time of setting the debug mode.

The circuit device main body may be configured to set the execution condition of the processing function in the normal mode of the circuit device main body according to information obtained from the data communication with the external control device when the debug mode is set. The setting of the execution condition of the processing function of the circuit device main body by the debug mode is performed, for example, by selectively obtaining various operation parameters, or the like stored in a memory provided in the integrated circuit device according to the data communication with the external control device and by presetting the obtained operation parameters, or the like to the circuit device main body.

According to the integrated circuit device configured in this manner, the operation mode determination circuit is reset at the time of turning-on of the power supply and after the debug processing by the debug mode of the circuit device main body. When the reset operation is released, the operation mode determination circuit which is configured to operate in accordance with the internal clock sets the operation mode of the circuit device main body to the normal mode or the debug mode according to a logical state of the particular one communication signal, for example, the communication clock which is data-communicated with the external control device.

Thus, at the time of switching the operation mode of the circuit device main body, unlike the conventional art, for example, it is not necessary to communicate an interrupt signal for the mode switching while managing the timers according to the communication mode. Further, it is not necessary to provide respective timer circuits on the external control device side and the integrated circuit device side to manage transmission/reception of the interrupt signal. Thus, according to an embodiment of the present invention, a circuit configuration of each of the external control device and the integrated circuit device does not become large in size and can be simplified. Further, according to the embodiment of the present invention, the operation mode of the circuit device main body can be switched efficiently in a short time under simple control according to the internal clock of the integrated circuit device without synchronizing with the communication clock which is communicated with the external control device. Thus, the integrated circuit device of the embodiment of the present invention is practically advantageous.

BRIEF DESCRIPTION OF THE DRAWING

FIGS. 11A and 11B are diagrams showing an example of an interruption processing procedure in a system of a related art when switching of the operation mode of the integrated circuit device is controlled from the control device side.

DETAILED DESCRIPTION

Hereinafter, an integrated circuit device according to embodiments of the present invention will be explained with reference to drawings.

Figure 1:
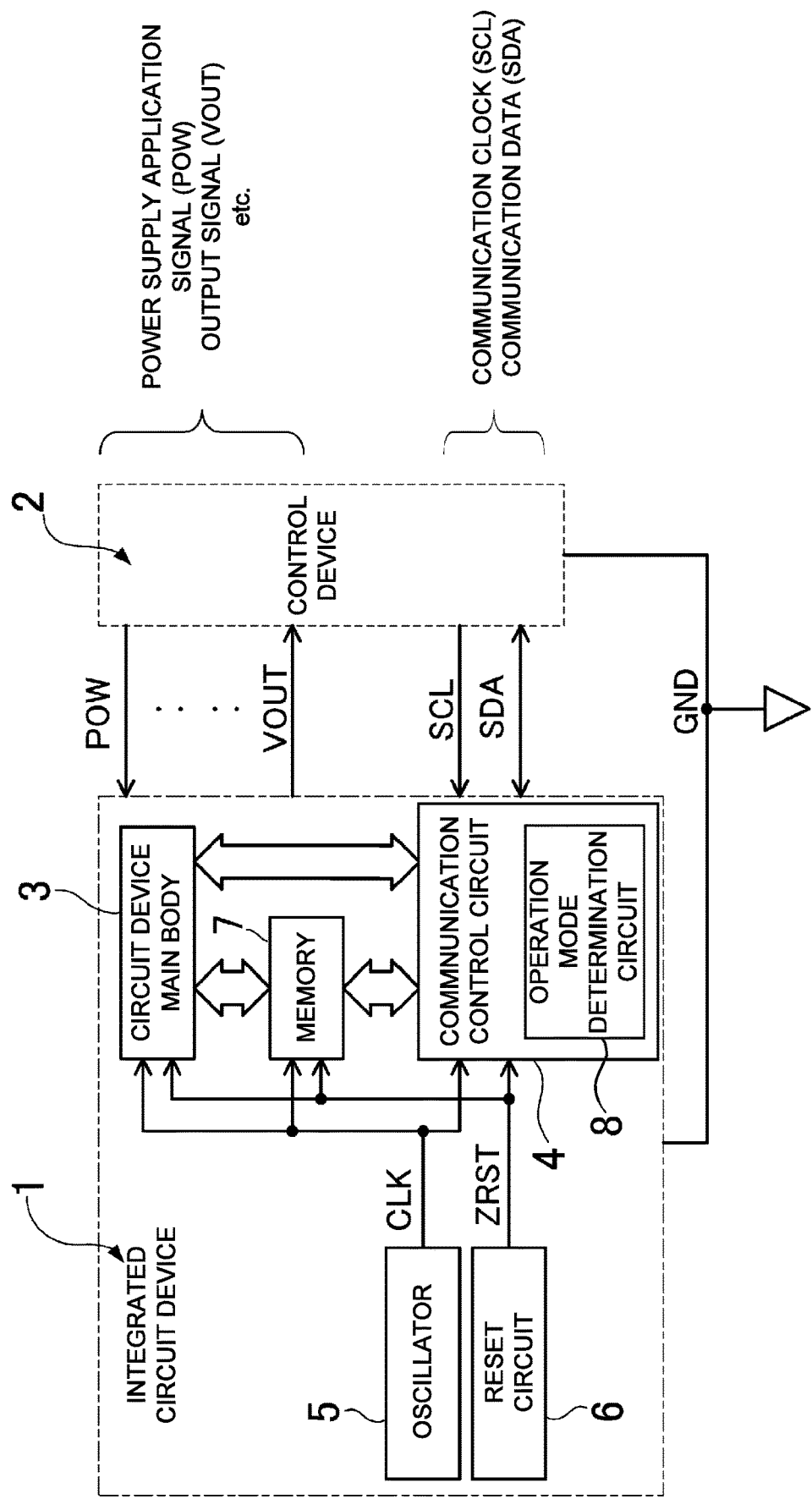
FIG. 1 is a diagram showing a schematic configuration of an integrated circuit device according to an embodiment of the present invention.

FIG. 1 is a diagram showing a schematic configuration of an integrated circuit device 1 according to the embodiment of the present invention. In FIG. 1, a reference numeral 2 denotes an external control device which performs data communication with the integrated circuit device 1. The control device 2 has a function of outputting a power supply application signal POW to the integrated circuit device 1, for turning on/off a power supply of the integrated circuit device 1 and receiving an output signal VOUT of the integrated circuit device 1. Further, the control device 2 has a function of outputting a communication clock SCL of a predetermined frequency to the integrated circuit device 1 and transmitting/receiving communication data SDA to/from the integrated circuit device 1 in synchronism with the communication clock SCL.

Relative to the control device 2, the integrated circuit device 1 according to an embodiment of the present invention includes a circuit device main body 3 which basically executes a predetermined processing function and a communication control circuit 4 which performs data communication with the control device 2. In a state where a normal mode is set, the circuit device main body 3 basically executes the predetermined processing function of, for example, turning on/off semiconductor switching elements (not shown) or the like while performing data communication with the control device 2.

The integrated circuit device 1 includes an oscillator 5 which generates an internal clock CLK of a predetermined frequency for determining respective operation timings of the circuit device main body 3 and the communication control circuit 4. The integrated circuit device 1 further includes a reset circuit 6 which generates a reset signal ZRST during a predetermined time period for resetting the circuit device main body 3 and the communication control circuit 4 at the time of turning-on of a power supply and at a predetermined timing after a debug processing by a debug mode described later. In particular, the reset circuit 6 releases the reset signal ZRST at a timing synchronous with the internal clock CLK. The integrated circuit device 1 further includes a memory 7 formed of, for example, an EPROM which stores a program and various parameters for setting an execution condition of the processing function of the circuit device main body 3.

The above-described debug mode in the integrated circuit device 1 is set in place of the normal mode in which the circuit device main body 3 executes the predetermined processing function. In the debug mode, parameter setting (debug) is performed on the circuit device main body 3, using the parameter stored in the memory 7, based on the data communication with the control device 2. The execution condition, or the like, of the processing function of the circuit device main body 3 are changed and set by the debug processing. The debug mode is basically set when the power supply of the integrated circuit device 1 is turned on, and also executed when the power supply of the integrated circuit device 1 is turned on again after the power supply of the integrated circuit device 1 is turned off.

Figure 2:
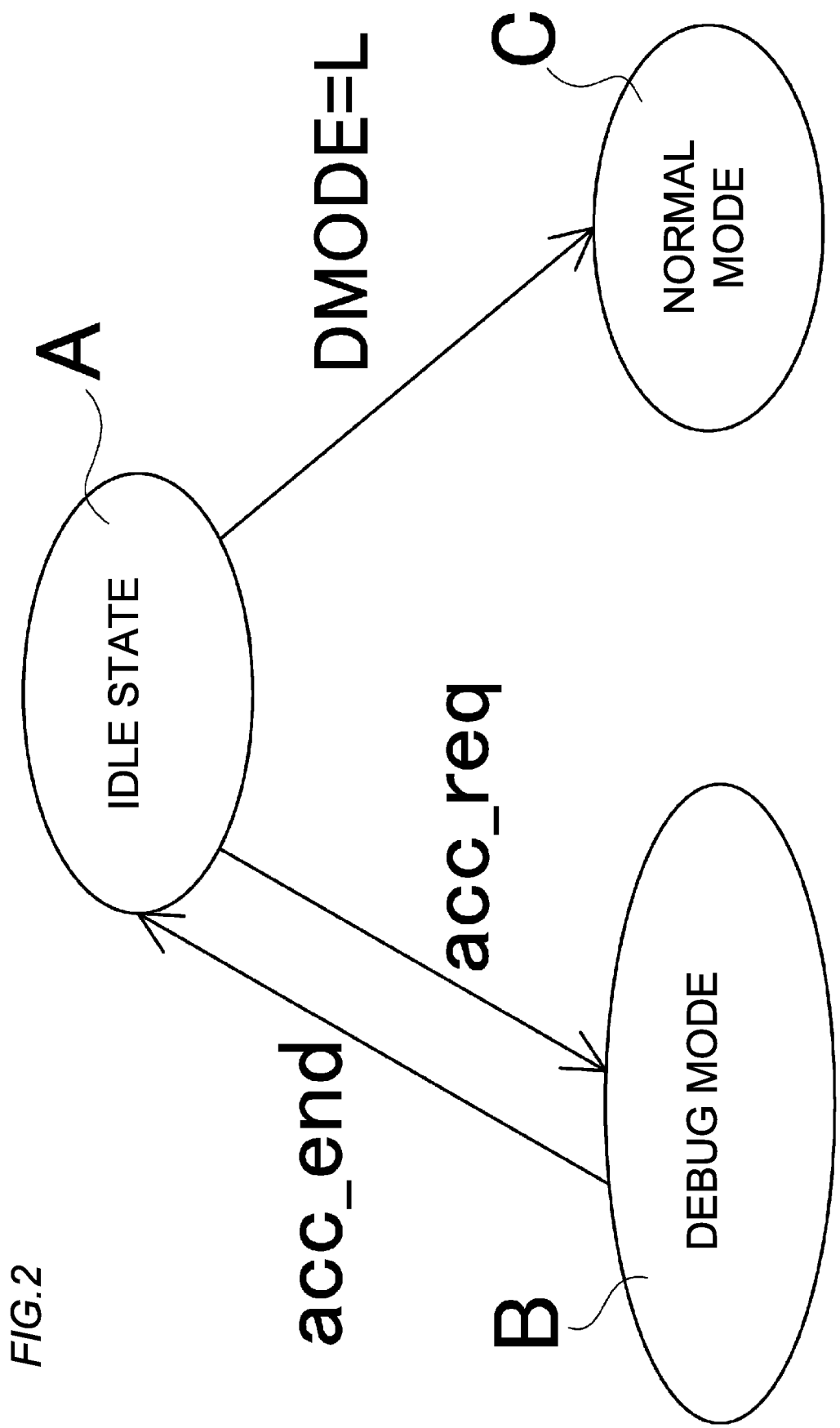
FIG. 2 is a state transition diagram showing a switching procedure of an operation mode in the integrated circuit device shown in FIG. 1.

FIG. 2 is a state transition diagram showing a switching procedure of the operation mode set in the integrated circuit device 1. The integrated circuit device 1 is set to an idle state A when the power supply of the integrated circuit device 1 is turned on. The power supply of the integrated circuit device 1 is turned on by applying the power supply application signal POW to the integrated circuit device 1 from the control device 2 side. In the idle state A, the integrated circuit device 1 operates, for example, an operation mode determination circuit 8 provided in the communication control circuit 4 at a predetermined timing. This timing is set as a setting timing of the idle state A or a reset release timing at which a predetermined delay time elapsed from the turn-on time of the power supply. The operation mode determination circuit 8 checks a voltage (logical state) of a communication terminal, to which, for example, the communication clock SCL is supplied from the control device 2 side, at the timing described above according to the internal clock CLK as described later. The operation mode determination circuit 8 determines whether to set a debug mode B or to set a normal mode C in accordance with the detected voltage (logical state) of the communication terminal.

The operation mode determination circuit 8 sets an operation mode output value DMODE to be output from the operation mode determination circuit 8 to an [L] level, so as to set the operation mode of the integrated circuit device 1 to the normal mode C. The operation mode determination circuit 8 sets the operation mode output value DMODE to an [H] level, so as to set the operation mode of the integrated circuit device 1 to the debug mode B.

The integrated circuit device 1 in which the debug mode B is set outputs a control signal [acc req] to the communication control circuit 4 as shown in FIG. 2 and thus starts a predetermined debug processing. When the parameter setting (debug) for the circuit device main body 3 is completed, the integrated circuit device 1 outputs a control signal [acc end] to the communication control circuit 4 as shown in FIG. 2 and thus releases the debug mode B. The integrated circuit device 1 returns to the idle state A in response to the release of the debug mode B.

In contrast, the integrated circuit device 1 in which the normal mode C is set, for example, operates the circuit device main body 3 and causes the circuit device main body to execute the predetermined processing function while performing data communication with the control device 2. The normal mode C is set even in the case where the data commination with the control device 2 is not necessary when the circuit device main body 3 executes the predetermined processing function. When the execution of the predetermined processing function by the circuit device main body 3 becomes unnecessary in the state where the integrated circuit device 1 is set to the normal mode C, the power supply of the integrated circuit device 1 is turned off by stopping the output of the power supply application signal POW from the control device 2 side. Thus, the normal mode C set in the integrated circuit device 1 is released. Incidentally, the output of the power supply application signal POW is also stopped by turning off the power supply of the control device 2.

Thereafter, when the power supply of the integrated circuit device 1 is turned on again by supplying the power supply application signal POW thereto from the control device 2 side so as to start the integrated circuit device 1, the integrated circuit device 1 is set to the idle state A. Then, as described above, the operation mode determination circuit 8 operates and selectively determines whether the integrated circuit device 1 is set to the debug mode B or the normal mode C.

Figure 3:
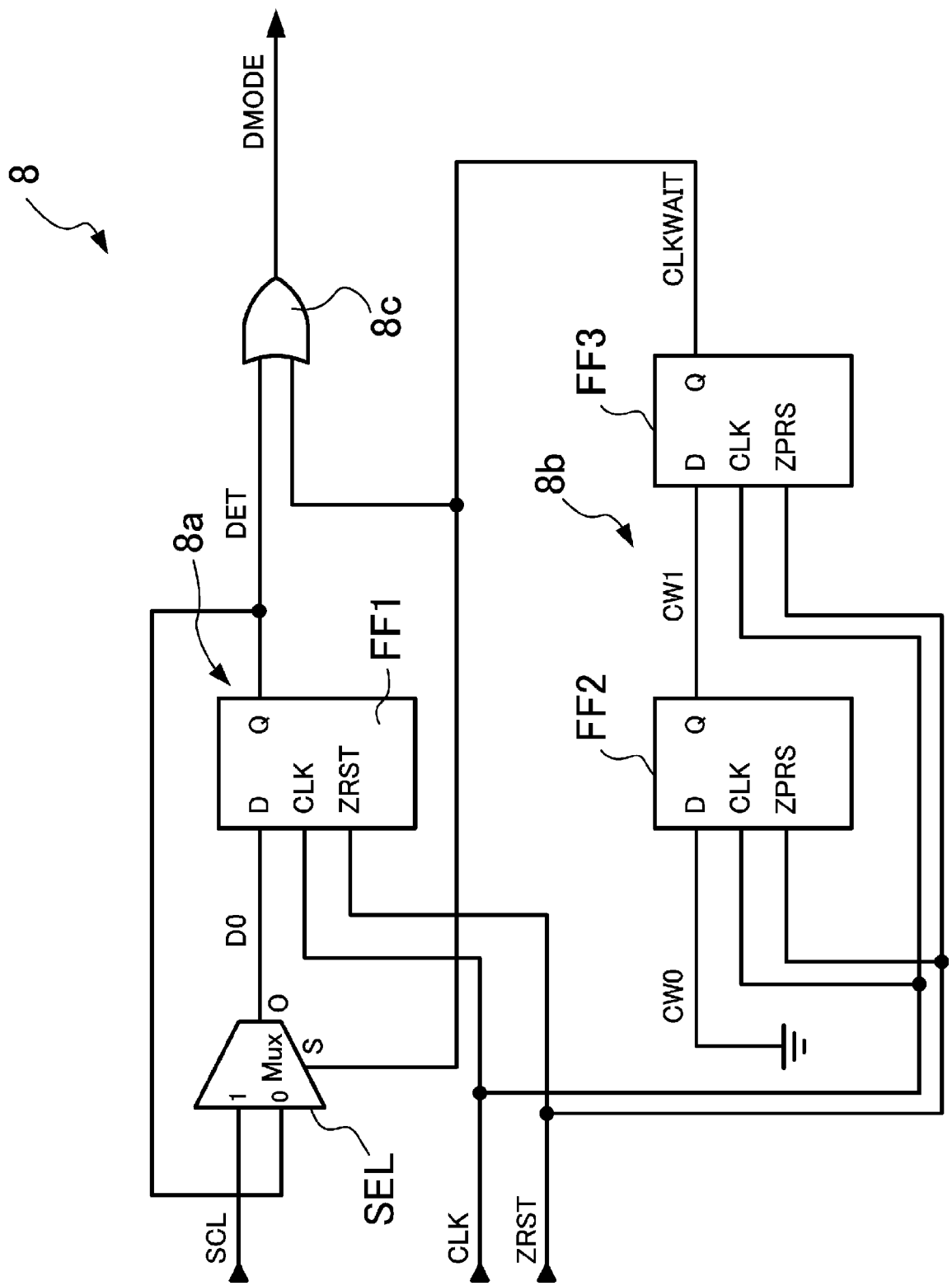
FIG. 3 is a diagram showing a configuration example of an operation mode determination circuit in the integrated circuit device shown in FIG. 1.

The operation mode determination circuit 8, which plays a key part in determining the operation mode of the integrated circuit device 1, is configured as shown in, for example, FIG. 3. The operation mode determination circuit 8 includes a flip-flop FF1 which operates in synchronism with the internal clock CLK after the reset operation is released. When the reset signal ZRST of an [L] level output from the reset circuit 6 is input to the flip-flop FF1, the flip-flop performs a reset operation to reset an output terminal Q (logical output DET) thereof to an [L] level. Then, the flip-flop FF1 sets a logical output of a signal to the output terminal Q. The logical output is applied to an input terminal D thereof in synchronism with the first rising timing t1 of the internal clock CLK after the reset operation is released in response to an [H] level of the reset signal ZRST Specifically, a signal selected by a selector SEL is input to the input terminal D of the flip-flop FF1. The selector SEL is a two-input selection type and selects its input in accordance with a logical output CLKWAIT of a preset-type flip-flop circuit 8*b* described later.

That is, the selector SEL selects the communication clock SCL supplied to the communication terminal when the logical output CLKWAIT is at an [H] level. The selector SEL selects the logical output DET of the flip-flop FF1 when the logical output CLKWAIT is at an [L] level. The logical output CLKWAIT is set to the [H] level at the timing t1 as described later, and thus the selector SEL selects the communication clock SCL supplied to the communication terminal and supplies the communication clock to the input terminal D of the flip-flop FF1. Consequently, the flip-flop FF1 sets the logical state of the communication clock SCL to the output terminal Q. The logical state of the communication clock SCL is selected by the selector SEL and supplied to the input terminal D at the timing t1.

The logical output DET of the flip-flop FF1 is returned to the selector SEL. In this case, as described later, the logical output CLKWAIT is set to the [L] level at a timing which is delayed by one clock of the internal clock CLK from the timing t1. As a result, the selector SEL selects the logical output DET of the flip-flop FF1 at the next rising timing t2 of the internal clock CLK delayed by one clock and supplies the selected logical output to the input terminal D of the flip-flop FF1. Thus, the logical state of the communication clock SCL supplied to the input terminal D of the flip-flop FF1 at the timing t1 is held by the flip-flop FF1. The logical state of the communication clock SCL held by the flip-flop FF1 is maintained until the flip-flop FF1 is reset by the reset signal ZRST.

Further, the operation mode determination circuit 8 includes the preset-type flip-flop circuit 8*b* which includes a plurality of stages of flip-flops more than a reset-type flip-flop circuit 8*a* formed of the flip-flop FF1, and for example, includes two stages of flip-flops FF2, FF3. When the reset signal ZRST of the [L] level is input to each of the flip-flops FF2, FF3, these flip-flops each perform a preset operation to set a logical output thereof to an [H] level. Then, the flip-flops FF2, FF3 each perform a set operation in synchronism with the first rising timing t1 of the internal clock CLK after the reset operation is released in response to the [H] level of the reset signal ZRST and set the logical state applied to an input terminal D thereof.

Specifically, the flip-flop FF2 sets the state of the input terminal D thereof, which is set to the ground voltage (0 V), to the output terminal Q thereof (logical output CW1) at the timing t1. In particular, the flip-flop FF2 of the first stage is set to an [L] level at the timing t1 and generates the logical output CW1 of an [L] level. The flip-flop FF3 of the succeeding stage sets the logical output CW1 of the flip-flop FF2 of the preceding stage and outputs the logical output CLKWAIT of the [L] level to the output terminal Q thereof.

The logical output CLKWAIT of the preset-type flip-flop circuit 8*b* is used as a signal for controlling the selection operation of the selector SEL. Consequently, when the selector SEL is supplied with the logical output CLKWAIT of the [L] level at the timing t2, the selector selects the logical output DET of the reset-type flip-flop circuit 8*a* in place of the signal representing the logical state of the communication clock SCL as described above.

The logical output CLKWAIT of the preset-type flip-flop circuit 8*b* is supplied to an OR circuit 8*c*. The OR circuit 8*c* outputs the logical output CLKWAIT or the logical output DET of the reset-type flip-flop circuit 8*a* as the operation mode output value DMODE for determining the operation mode of the circuit device main body 3. As a result, after the timing t2, the logical output DET of the reset-type flip-flop circuit 8*a* is output via the OR circuit 8*c* regardless of the change in the logical state of the communication clock SCL until the reset signal ZRST is supplied. The operation mode output value DMODE is determined according to the logical output DET.

After the integrated circuit device 1 is set to the normal mode C according to the operation mode output value DMODE, the logical output DET of the flip-flop FF1 is input to the input terminal D of the flip-flop FF1 until the reset circuit 6 outputs the reset signal ZRST of the [L] level. Thus, the logical output DET of the flip-flop FF1 is held regardless of the input number of the internal clock CLK which is supplied repeatedly at the predetermined frequency. Consequently, the communication of the communication data SDA can be performed with the control device 2 using the communication clock SCL from a certain timing at which the logical state of the communication clock SCL changes to an [H] level.

Figure 4:
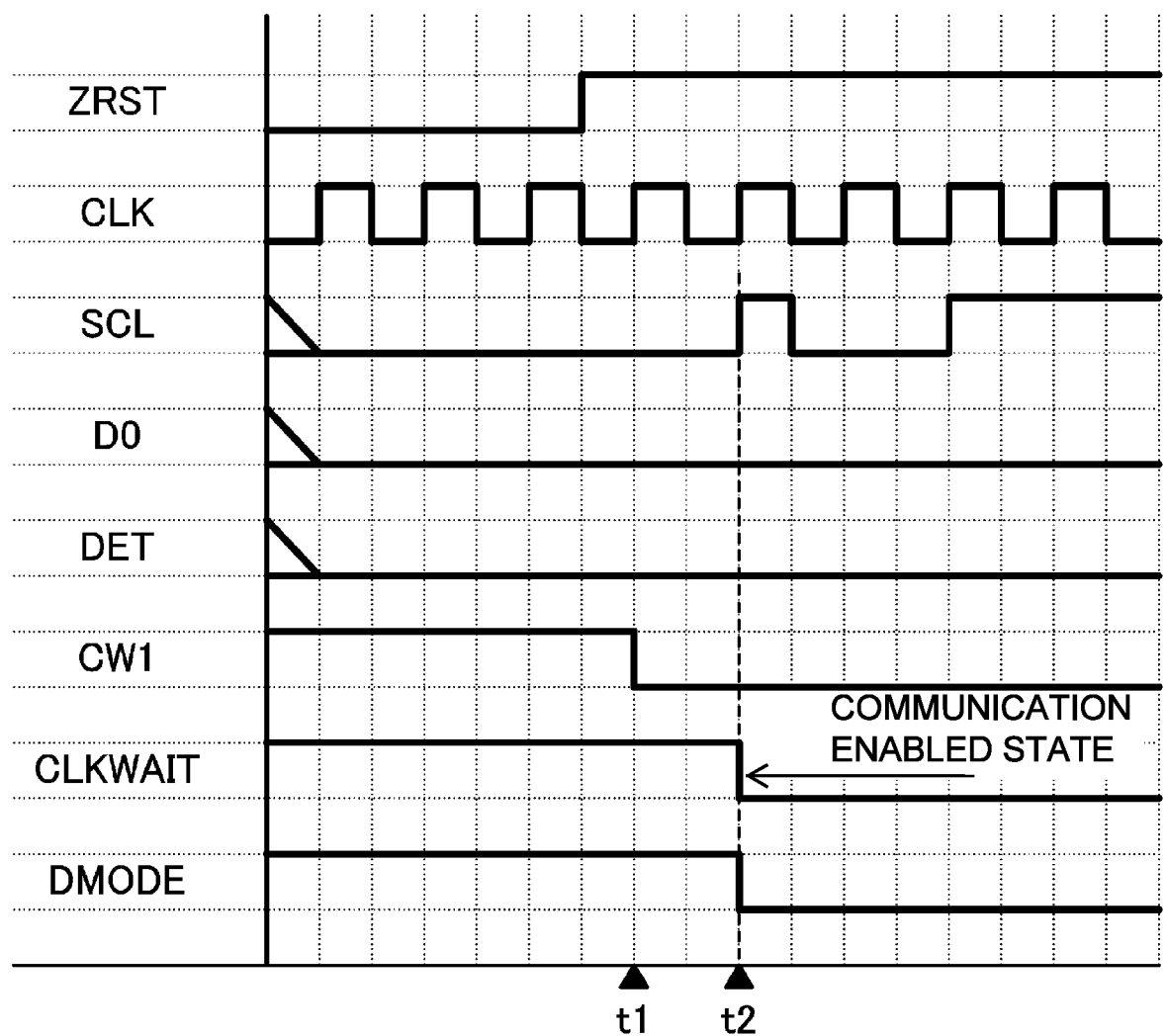
FIG. 4 is a timing chart showing operation states at the time of setting a normal mode in the operation mode determination circuit shown in FIG. 3.
Figure 5:
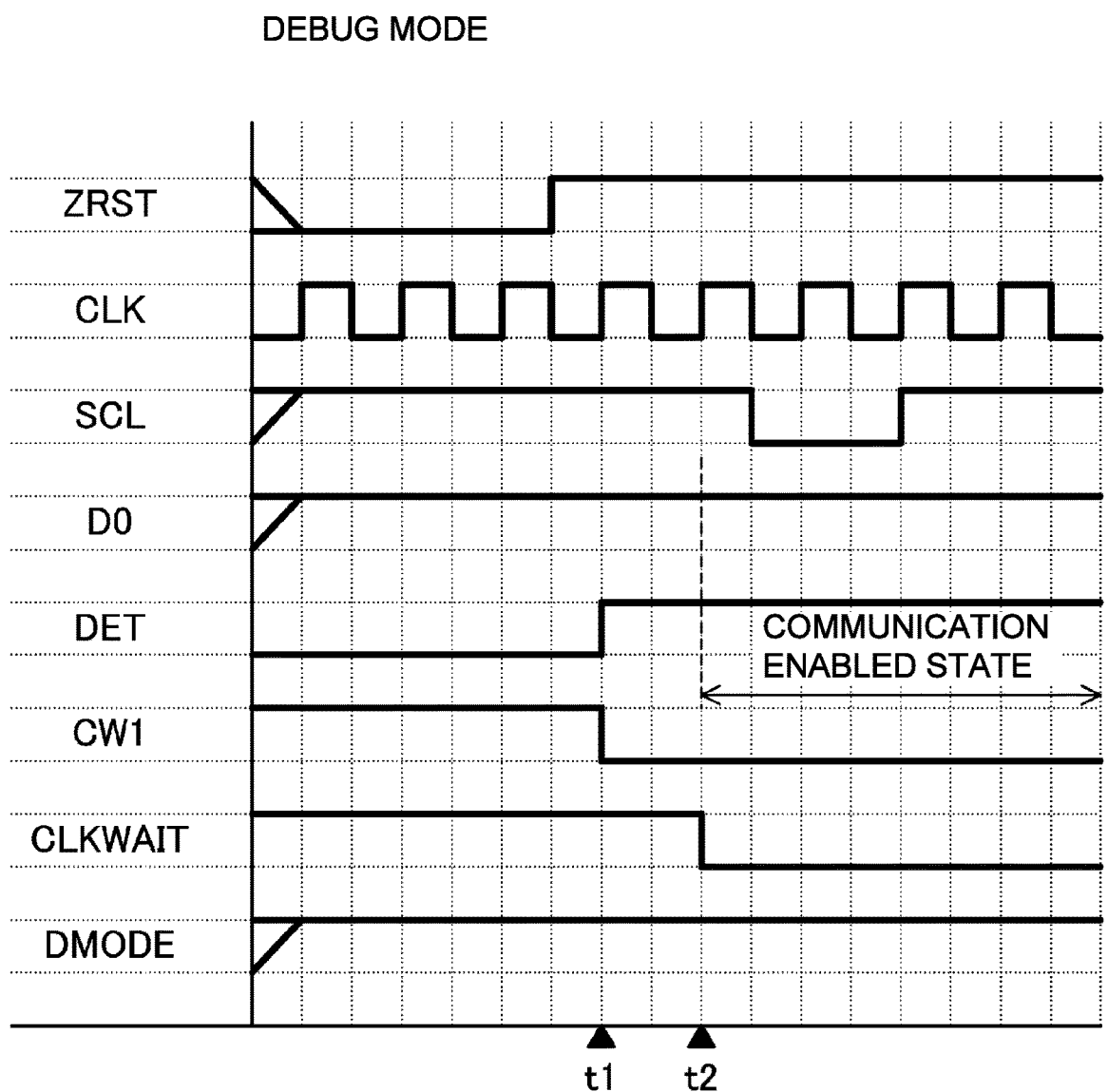
FIG. 5 is a timing chart showing operation states at the time of setting a debug mode in the operation mode determination circuit shown in FIG. 3.
Figure 6:
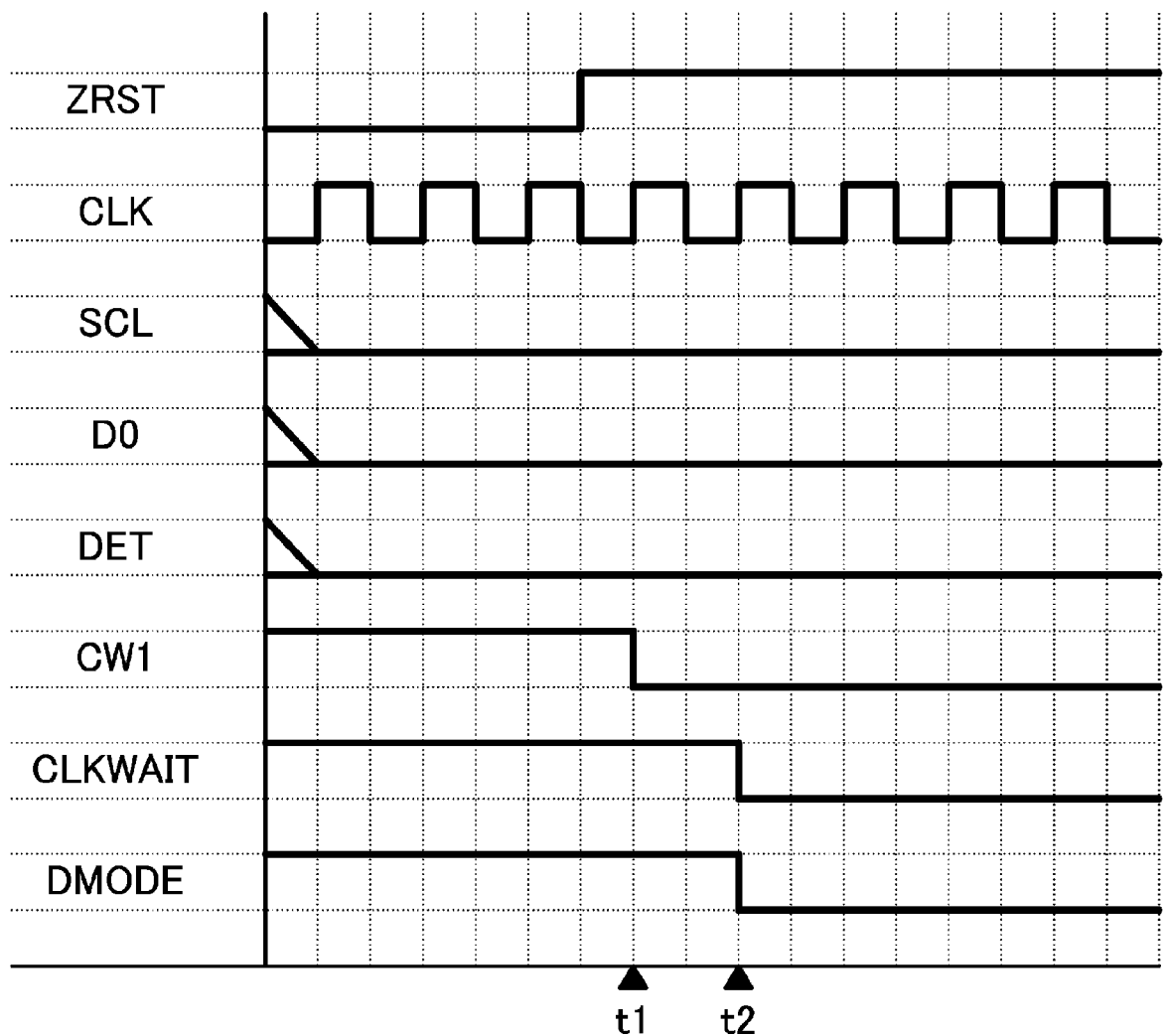
FIG. 6 is a timing chart showing operation states at the time of setting the normal mode, which is not accompanied by communication with a control device, in the operation mode determination circuit shown in FIG. 3.

FIGS. 4 to 6 are timing charts showing the operation of the operation mode determination circuit 8 configured in the heretofore described manner. FIG. 4 shows the timing chart at the time of setting the normal mode, and FIG. 5 shows the timing chart at the time of setting the debug mode. FIG. 6 shows the timing chart at the time of setting the normal mode in the case of not being accompanied by the data communication with the control device 2.

According to the operation mode determination circuit 8 configured in this manner, as shown in FIG. 4, when the internal clock signal CLK rises to an [H] level at the timing t1, the logical output CW1 of the flip-flop FF2 in the preset-type flip-flop circuit 8*b* changes to the [L] level. Thereafter, the logical output CLKWAIT of the flip-flop FF3 changes to the [L] level at the timing t2 delayed by one clock of the internal clock CLK.

In contrast, the flip-flop FF1 of the reset-type flip-flop circuit 8*a* sets the logical state of the communication clock SCL at the timing t1. In this case, the logical state of the communication clock SCL is the [L] level, and the output DO of the selector SEL is also at the [L] level. Thus, as shown in FIG. 4, the logical output DET of the flip-flop FF1 is kept at the [L] level. Further, at the timing t1, the logical output CLKWAIT of the flip-flop FF3 is preset to the [H] level. Thus, the OR circuit 8*c* maintains the operation mode output value DMODE of the [H] level as the output thereof in response to the logical output CLKWAIT. [00*x*4] At the timing t2 which is delayed by one clock of the internal clock CLK from the timing t1, however, the logical output CLK-WAIT of the flip-flop FF3 changes to the [L] level. At this timing t2, the logical output DET of the flip-flop FF1 which detects the logical state of the communication clock SCL is kept at the [L] level, and the operation mode output value DMODE as the output of the OR circuit 8c changes to the [L] level. As a result, the operation mode output value DMODE output from the OR circuit 8c is set to the [L] level at this timing t2. Then, the operation mode of the integrated circuit device 1 is set to the normal mode C according to this operation mode output value DMODE.

At this time, as described above, the input of the selector SEL is switched by the logical output CLKWAIT of the flip-flop FF3, and the signal (logical output DET) of the output terminal Q of the flip-flop FF1 is fed back to the input terminal of the flip-flop FF1. Consequently, the logical output DET of the flip-flop FF1 is kept at the [L] level, and thus the operation mode output value DMODE is set to the [L] level at the timing t2.

By turning on the communication clock SCL on and after this timing t2, a mode enabling the data communication with the control device 2 is set with respect to the communication control circuit 4. In other words, the logical output CLK-WAIT of the flip-flop FF3 is set to the [L] level, and thereafter this setting state is maintained. Thus, the normal mode C enabling the data communication with the control device 2 via the communication control circuit 4 is set.

On the other hand, in the case of setting the debug mode B, the communication clock SCL is set to the [H] level as shown in FIG. 5 under the control of the control device 2 at the first rising timing t1 of the internal clock CLK after the reset signal ZRST is released. In other words, the control device 2 controls the communication clock SCL so as to be the [H] level at the timing t1, and thereby setting the debug mode B. In this case also the logical output CW1 of the flip-flop FF2 in the preset-type flip-flop circuit 8b changes to the [L] level at the timing t1. Then the logical output CLKWAIT of the flip-flop FF3 changes to the [L] level at the timing t2 which is delayed by one clock of the internal clock CLK from the timing t1.

As shown in FIG. 5, however, the logical state of the communication clock SCL is set to the [H] level and the output D0 of the selector SEL is at the [H] level at the timing t1, the logical output DET of the flip-flop FF1 is also kept at the [H] level at the timing t2. The input of the selector SEL is switched by the logical output CLKWAIT of the flip-flop FF3 at the timing t2, and the logical output DET of the flip-flop FF1 set to the [H] level is fed back to the flip-flop FF1. Thus, even when the logical state of the communication clock SCL changes thereafter, the logical output DET of the flip-flop FF1 is kept at the [H] level.

As a result, the operation mode output value DMODE output from the OR circuit 8c is kept at the [H] level on and after the timing t2. Thus, the operation mode of the integrated circuit device 1 is set to the debug mode B according to the operation mode output value DMODE set to the [H] level. After the timing t2 after the reset operation is released, the input of the selector SEL is switched in response to the logical output CLKWAIT of the flip-flop FF3 and thus the logical output DET of the flip-flop FF1 is not changed even when the communication clock SCL is changed. Thus, after the timing t2, the operation mode output value DMODE is kept at the [H] level, and the debug mode B set in this manner is maintained. Accordingly, the data communication can be performed with the control device 2 in synchronism with the communication clock SCL even when the debug mode B is set.

Incidentally, in the case where the data communication with the control device 2 is not necessary in the normal mode C, for example, a configuration may be adopted such as to ground the communication terminal of the integrated circuit device 1 for receiving the communication clock SCL from the control device 2 and thereby forcibly set the communication terminal to the [L] level. With this configuration, as shown in FIG. 6, the communication clock SCL can be kept at the [L] level after the timing t2 and so the setting state of the normal mode C can be easily maintained safely.

In other words, the switching of the operation mode of the integrated circuit device 1 can be prevented from being executed involuntarily due to the communication clock SCL. That is, the operation mode of the integrated circuit device can be set to the debug mode B or the normal mode C according to the logical state of the terminal without being affected by the communication clock SCL. The logical state of the terminal is supplied to the communication clock SCL in response to the internal clock CLK generated from the integrated circuit device 1, Thus, according to the integrated circuit device 1 of the embodiment of the present invention, for example, unlike the operation mode switching method disclosed in JP-A-2011-64470, neither the control device 2 nor the integrated circuit device 1 is required to incorporate a timer circuit therein and thus the configuration of each device can be simplified significantly. Further, it is not necessary to output the control signal for switching the operation mode from the control device side at the time at which the predetermined time elapsed after the interruption processing, and also it is not necessary to determine the voltage (logical state) of the control signal after elapsing the predetermined time on the integrated circuit device side. In this respect, the configuration of each device can also be simplified. Thus, the integrated circuit device 1 of the embodiment of the present invention is practically advantageous.

The operation mode determination circuit 8 shown in FIG. 3 is configured to determine the logical state of the external clock SCL at the timing t2 which is delayed by one clock of the internal clock CLK from the first rising timing t1 of the internal clock CLK after the reset operation of the operation mode determination circuit 8 is released, and output the operation mode output value DMODE. However, a configuration may be adopted to determine the logical state of the external clock SCL at a timing t3 which is delayed for example by two clocks of the internal clock CLK from the timing t1, and thereby eliminate the influence of fluctuation of the internal clock CLK and improve the determination accuracy of the logical state of the external clock SCL.

Figure 7:
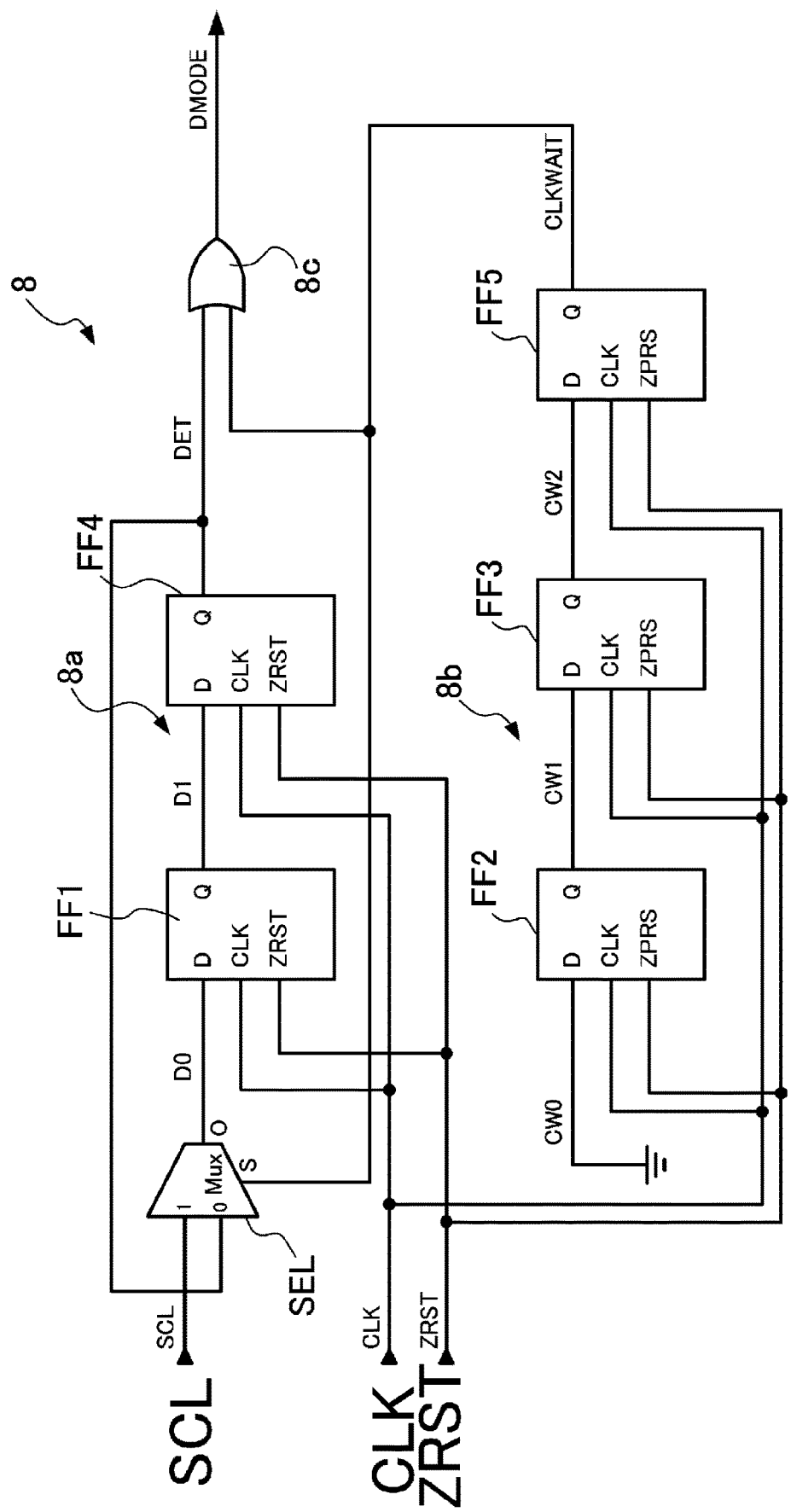
FIG. 7 is a diagram showing another configuration example of the operation mode determination circuit.

FIG. 7 shows a configuration example of the operation mode determination circuit 8 which is arranged in view of this consideration. In the operation mode determination circuit 8 shown in FIG. 7 by way of example, a reset-type flip-flop circuit 8a includes two stages of flip-flops FF1, FF4 by providing the flip-flop FF4 in addition to the flip-flop FF1. Further, the feature of the operation mode determination circuit 8 shown in FIG. 7 by way of example is that a preset-type flip-flop circuit 8b is configured by providing a flip-flop FF5 of the third stage in addition to the two stages of the flip-flops FF2, FF3.

Here, logical outputs of the flip-flop FF1 and the flip-flop FF4 in the reset-type flip-flop circuit 8a are denoted by D1 and DET, respectively. Further, logical outputs of the flip-flop FF2 of the first stage, the flip-flop FF3 of the second stage, and the flip-flop FF5 of the third stage in the preset-type flip-flop circuit 8b are denoted by CW1, CW2 and CLKWAIT, respectively. The operations of these flip-flops FF1 to FF5 are the same as those of the flip-flops FF1 to FF3 in the operation mode determination circuit 8 described with reference to FIG. 3.

Figure 8:
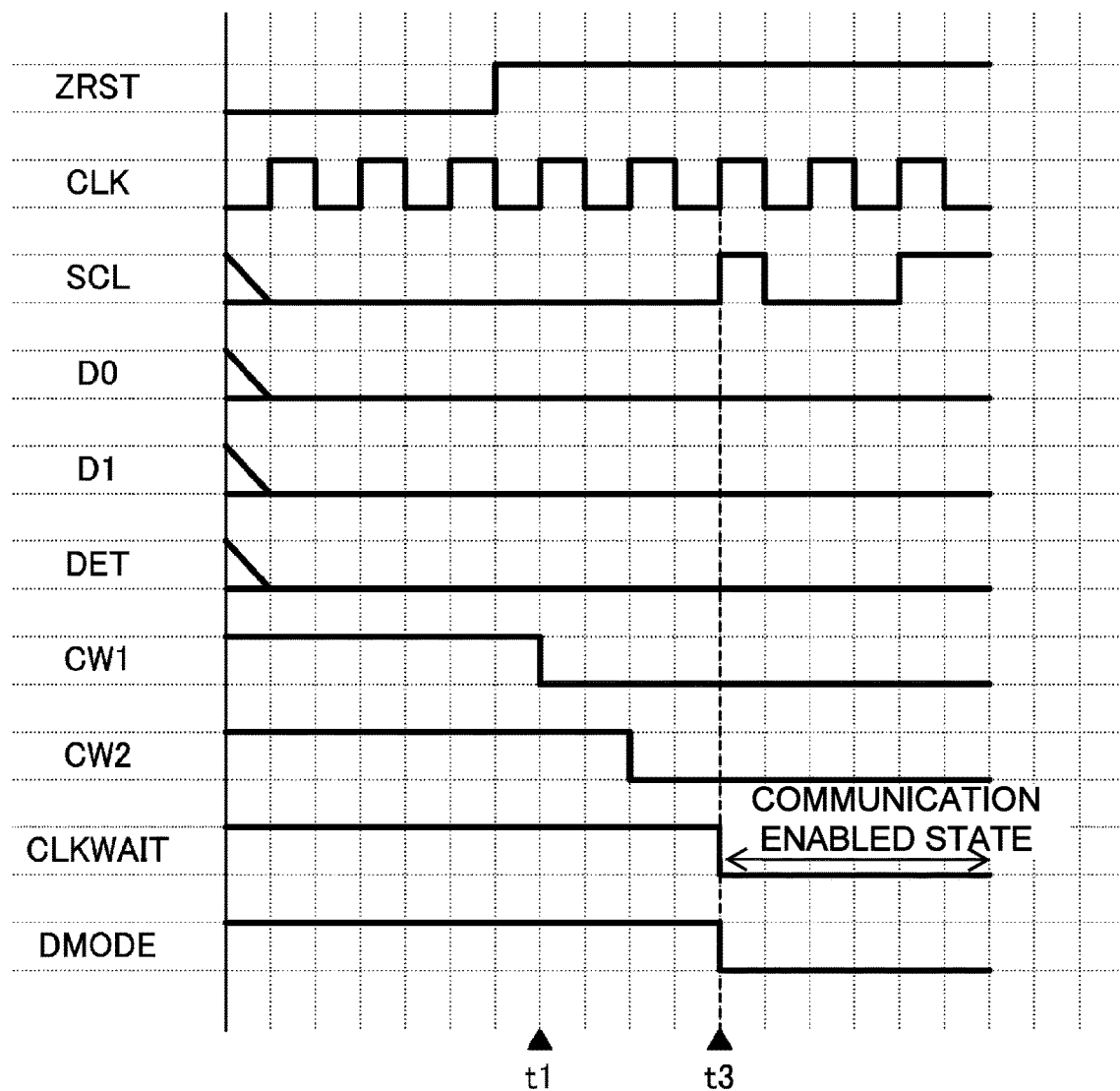
FIG. 8 is a timing chart showing operation states at the time of setting the normal mode in the operation mode determination circuit shown in FIG. 7.
Figure 9:
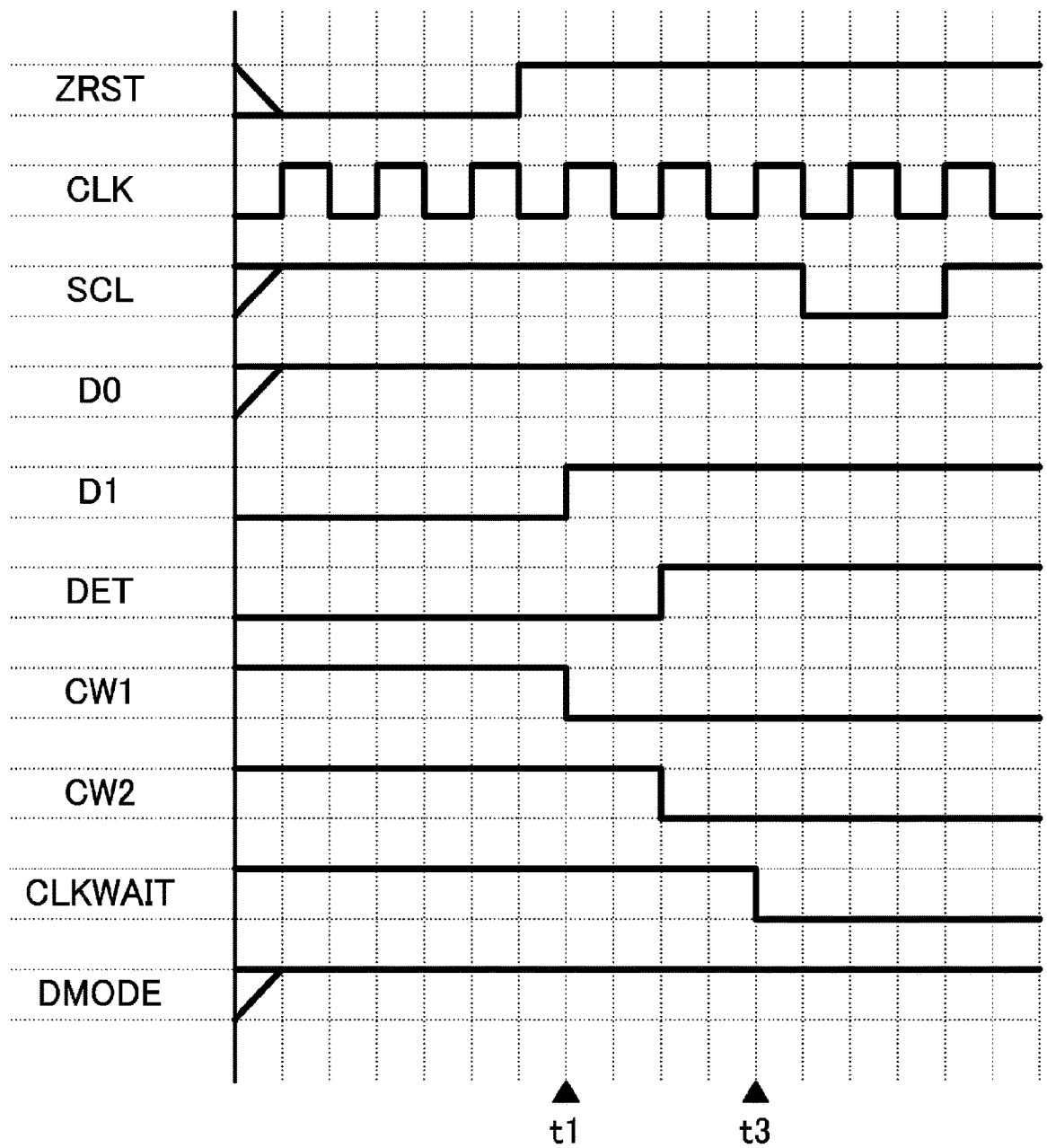
FIG. 9 is a timing chart showing operation states at the time of setting the debug mode in the operation mode determination circuit shown in FIG. 7.

According to the operation mode determination circuit 8 configured in this manner, as shown in FIG. 8 representing a timing chart at the time of setting the normal mode C and FIG. 9 representing a timing chart at the time of setting the debug mode B, the operation mode output value DMODE can be stably and surely determined regardless of fluctuation of the internal clock CLK at the timing t3 which is delayed by two clocks from the timing t1 after the reset operation is released. Thus, effect more than that of the embodiment described above can be achieved.

Figure 10:
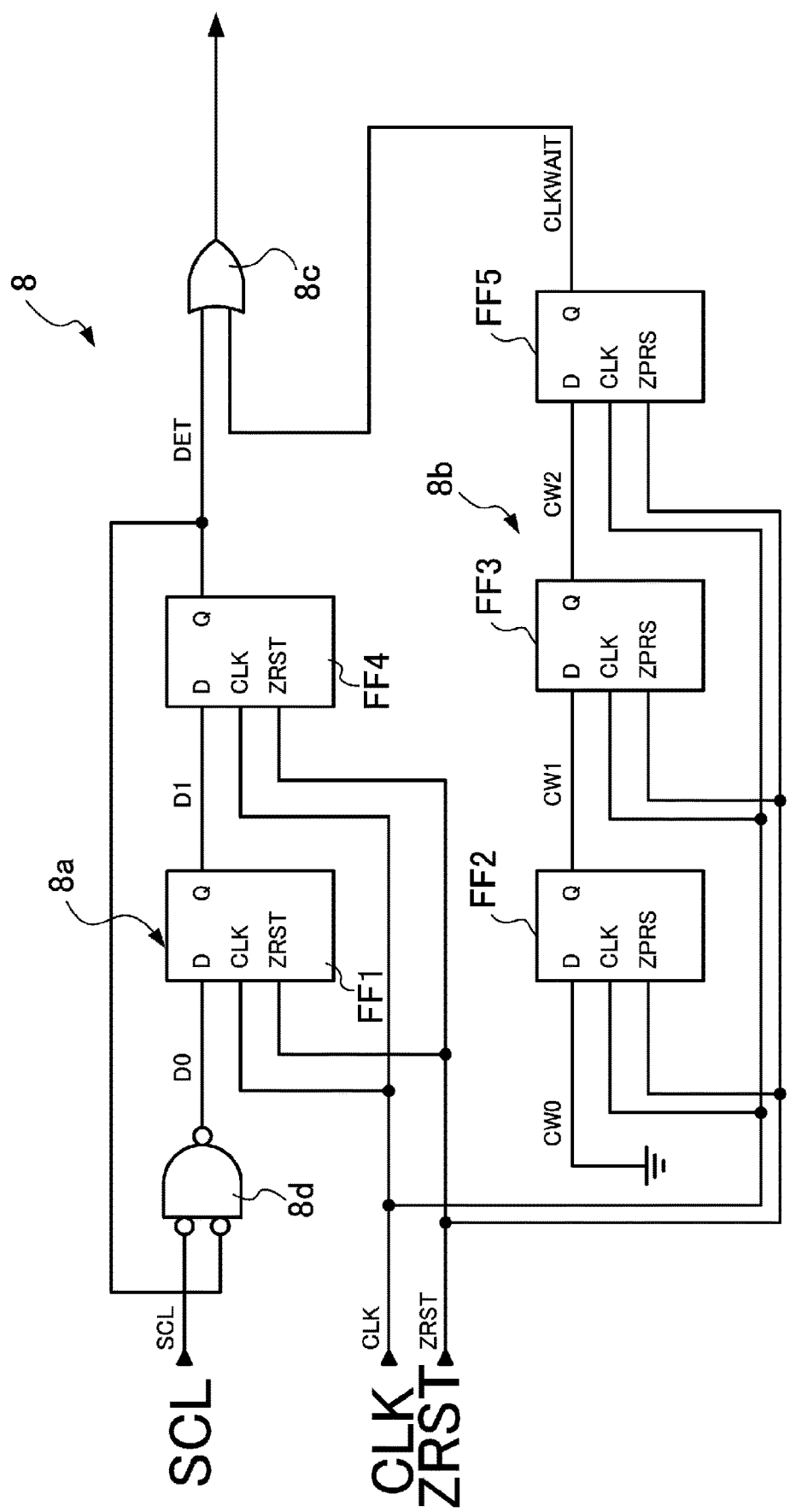
FIG. 10 is a diagram showing still another configuration example of the operation mode determination circuit.

The present invention is not limited to the above-descried embodiments. For example, in the case where the data communication with the control device 2 is not necessary in the operation mode C, a configuration may be adopted, for example, to control a signal which is supplied to the input terminal of the flip-flop FF1 via an AND circuit 8*d* having negative logic input/output (OR circuit of a positive logic) in place of the selector SEL, as shown in FIG. 10. In this case, the communication clock SCL is supplied to the flip-flop FF1 at the first rising timing t1 of the internal clock CLK after the reset operation is released, and further a logical output DET of the flip-flop FF4 is supplied to the flip-flop FF1 at the timing delayed by one clock of the internal clock CLK. The operation mode output value DMODE is set to the [L] level by the logical output DET of the reset-type flip-flop circuit 8*a* or the logical output CLKWAIT of the preset-type flip-flop circuit 8*b*.

As a result, at the time of setting the normal mode C, the terminal of the integrated circuit device 1, to which the communication clock SCL is supplied from the control device 2, is forcibly set to the [L] level, and thus a normal mode C not accompanied with the data communication is set. Thus, this embodiment functions as with the above-described embodiments.

As described above, the logical state of the communication clock SCL is determined at the timing delayed by one or two clocks of the internal clock CLK. A configuration may of course be adopted to increase the number of stages in the flip-flop circuit and determine the logical state of the communication clock SCL at a further delayed timing. Further, a configuration may of course be adopted to control one logical state of a terminal for transmitting/receiving the communication data SDA in place of the communication clock SCL, and thereby control the switching of the operation mode.

However, the communication data SDA itself is a data signal, and so even when the terminal for transmitting/receiving the communication data SDA is in an open state, this state is not a factor for directly causing an erroneous operation of the internal circuit. On the other hand, the communication clock SCL is a signal used as a clock for communication, and so the internal clock may operate erroneously when a signal value of this clock is unstable.

Thus, in the above-described embodiments, the state of the communication clock SCL serving as a factor for causing an erroneous operation of the internal circuit, is daringly used as information for the mode setting as described above. Specifically, the control device 2 determines the state of the communication clock SCL in a period from a time at which the power supply application signal POW is output to a time at which the reset signal ZRST changes from the [L] level to the [H] level in the integrated circuit device 1. As a result, the state of the communication clock SCL is determined before the reset circuit 6 releases the reset operation in the integrated circuit device 1.

In this respect, the integrated circuit device 1 resets the communication control circuit 4 using the reset signal ZRST. Thus, the integrated circuit device 1 determines the state of the communication clock SCL after releasing the reset operation with respect to the communication control circuit 4. Thus, the integrated circuit device 1 can surely set the operation mode according to the state of communication clock SCL supplied from the control device 2.

Further, in the integrated circuit device 1 shown in FIG. 1, although the operation mode determination circuit 8 is provided in the communication control circuit 4, the operation mode determination circuit 8 may of course be incorporated in the circuit device main body 3. The processing function performed by the circuit device main body 3 of the integrated circuit device 1 is not limited to the on/off operation of the semiconductor switching elements described above. The invention can be implemented in such a way as to be changed in various manners in a range not departing from the gist of the invention.

The invention claimed is:

1. An integrated circuit device, comprising:
 a circuit device main body configured to execute a predetermined processing function;
 a communication control circuit configured to perform data communication with an external control device; and
 an operation mode determination circuit configured to selectively determine, as an operation mode of the circuit device main body, a normal mode for executing the predetermined processing function or a debug mode for setting an execution condition of the predetermined processing function, and to generate an operation mode output value for determining the operation mode of the circuit device main body according to a logical state of a particular one communication signal data-communicated with the external control device after a reset operation performed by a reset circuit is released, the reset circuit being configured to output a reset signal at a time of turning-on of a power supply so as to initialize the operation mode determination circuit and perform the reset operation,
 wherein the circuit device main body is configured to set the execution condition of the predetermined processing function in the normal mode of the circuit device main body according to information obtained from the data communication with the external control device when the debug mode is set.

2. The integrated circuit device according to claim 1, further comprising an external input port to which the particular one communication signal is input,
 wherein a communication clock supplied from the external control device is input to the external input port after the particular one communication signal is input to the external input port.

3. The integrated circuit device according to claim 2, wherein the operation mode determination circuit is configured to generate the operation mode output value for determining the operation mode of the circuit device main body according to a logical state which is obtained as a voltage level of the external input port after the release of the reset operation.

4. The integrated circuit device according to claim 1, wherein the operation mode determination circuit is configured to generate the operation mode output value in accordance with an internal clock, and wherein the operation mode determination circuit comprises:
a reset-type flip-flop circuit which includes a flip-flop configured to operate in synchronism with the internal clock after the release of the reset operation and set the logical state of the particular one communication signal supplied to an input terminal thereof, and which is configured to feed back a logical output of the flip-flop to the input terminal in place of the particular one communication signal;
a preset-type flip-flop circuit which includes a plurality of stages of flip-flops more than the reset-type flip-flop circuit, wherein the plurality of stages of flip-flops include a flip-flop of a first stage which is configured to operate in synchronism with the internal clock to be preset to a low level after the release of the reset operation, and a flip-flop of a succeeding stage which is configured to operate in synchronism with the internal clock and in which a logical output of the flip-flop of a preceding stage is set; and
an OR circuit which is configured to output a logical output of the preset-type flip-flop circuit or a logical output of the reset-type flip-flop circuit as the operation mode output value for determining the operation mode of the circuit device main body.

5. The integrated circuit device according to claim 2, wherein the operation mode determination circuit is configured to set the normal mode by fixing the external input port to a low level in a case where the normal mode of the circuit device main body is not accompanied by the data communication with the external control device, and
wherein the operation mode determination circuit is configured to fix the external input port to a high level at a time of setting the debug mode.

6. The integrated circuit device according to claim 1, further comprising an oscillator configured to generate an internal clock for determining respective operation timings of the circuit device main body and the communication control circuit,
wherein the operation mode determination circuit is configured to generate the operation mode output value in accordance with the internal clock generated by the oscillator.

7. An integrated circuit device, comprising:
a circuit device main body configured to execute a predetermined processing function;
a communication control circuit configured to perform data communication with an external control device; and
an operation mode determination circuit configured to selectively determine, as an operation mode of the circuit device main body, a normal mode for executing the predetermined processing function or a debug mode for setting an execution condition of the predetermined processing function, and to generate an operation mode output value for determining the operation mode of the circuit device main body according to a logical state of a particular one communication signal data-communicated with the external control device after a reset operation performed by a reset circuit is released, the reset circuit being configured to output a reset signal at a time of turning-on of a power supply so as to initialize the operation mode determination circuit and perform the reset operation, and to output the reset signal after a debug processing by the debug mode of the circuit device main body.

8. An integrated circuit device, comprising:
a circuit device main body configured to execute a predetermined processing function;
a communication control circuit configured to perform data communication with an external control device;
an external input port; and
an operation mode determination circuit configured to selectively determine, as an operation mode of the circuit device main body, a normal mode for executing the predetermined processing function or a debug mode for setting an execution condition of the predetermined processing function, and to generate an operation mode output value for determining the operation mode of the circuit device main body according to a logical state of a particular one communication signal data-communicated with the external control device after a reset operation performed by a reset circuit is released,
wherein
the particular one communication signal is input to the external input port, and
a communication clock supplied from the external control device is input to the external input port after the particular one communication signal is input to the external input port.

9. The integrated circuit device according to claim 8, wherein the reset circuit is configured to output a reset signal at a time of turning-on of a power supply and after a debug processing by the debug mode of the circuit device main body, so as to initialize the operation mode determination circuit and perform the reset operation.

10. The integrated circuit device according to claim 8, wherein the operation mode determination circuit is configured to generate the operation mode output value for determining the operation mode of the circuit device main body according to a logical state which is obtained as a voltage level of the external input port after the release of the reset operation.

11. The integrated circuit device according to claim 8, wherein
the operation mode determination circuit is configured to generate the operation mode output value in accordance with an internal clock, and
the operation mode determination circuit comprises:
a reset-type flip-flop circuit which includes a flip-flop configured to operate in synchronism with the internal clock after the release of the reset operation and set the logical state of the particular one communication signal supplied to an input terminal thereof, and which is configured to feed back a logical output of the flip-flop to the input terminal in place of the particular one communication signal;
a preset-type flip-flop circuit which includes a plurality of stages of flip-flops more than the reset-type flip-flop circuit, wherein the plurality of stages of flip-flops include a flip-flop of a first stage which is configured to operate in synchronism with the internal clock to be preset to a low level after the release of the reset operation, and a flip-flop of a succeeding stage which is configured to operate in synchronism with the internal clock and in which a logical output of the flip-flop of a preceding stage is set; and
an OR circuit which is configured to output a logical output of the preset-type flip-flop circuit or a logical output of the reset-type flip-flop circuit as the operation mode output value for determining the operation mode of the circuit device main body.

12. The integrated circuit device according to claim 8, wherein
the operation mode determination circuit is configured to set the normal mode by fixing the external input port to a low level in a case where the normal mode of the circuit device main body is not accompanied by the data communication with the external control device, and
the operation mode determination circuit is configured to fix the external input port to a high level at a time of setting the debug mode.

13. The integrated circuit device according to claim 8, wherein the circuit device main body is configured to set the execution condition of the predetermined processing function in the normal mode of the circuit device main body according to information obtained from the data communication with the external control device when the debug mode is set.

14. The integrated circuit device according to claim 8, further comprising an oscillator configured to generate an internal clock for determining respective operation timings of the circuit device main body and the communication control circuit,
wherein the operation mode determination circuit is configured to generate the operation mode output value in accordance with the internal clock generated by the oscillator.

15. The integrated circuit device according to claim 14, wherein the communication control circuit is configured to receive the communication clock via the external input port and communication data synchronized with the communication clock after the particular one communication signal is input in the operation mode determination circuit according to the internal clock so as to generate the operation mode output value.

16. An integrated circuit device, comprising:
a circuit device main body configured to execute a predetermined processing function;
a communication control circuit configured to perform data communication with an external control device;
an oscillator configured to generate an internal clock for determining respective operation timings of the circuit device main body and the communication control circuit;
an external input port configured to receive a communication clock; and
an operation mode determination circuit configured to selectively determine, as an operation mode of the circuit device main body, a normal mode for executing the predetermined processing function or a debug mode for setting an execution condition of the predetermined processing function, and to operate in accordance with the internal clock generated by the oscillator and to generate an operation mode output value for determining the operation mode of the circuit device main body according to a logical state of a communication signal data-communicated with the external control device after a reset operation performed by a reset circuit is released,
wherein the communication control circuit is configured to receive the communication clock and communication data synchronized with the communication clock.

17. The integrated circuit device according to claim 16, wherein the reset circuit is configured to output a reset signal at a time of turning-on of a power supply and after a debug processing by the debug mode of the circuit device main body, so as to initialize the operation mode determination circuit and perform the reset operation.

18. The integrated circuit device according to claim 16, wherein
the external input port is further configured to receive the particular one communication signal, and
the communication clock is received by the external control device after the particular one communication signal is input to the external input port.

19. The integrated circuit device according to claim 16, wherein the operation mode determination circuit is configured to generate the operation mode output value for determining the operation mode of the circuit device main body according to a logical state which is obtained as a voltage level of the external input port after the release of the reset operation.

20. The integrated circuit device according to claim 16, wherein the operation mode determination circuit comprises:
a reset-type flip-flop circuit which includes a flip-flop configured to operate in synchronism with the internal clock after the release of the reset operation and set the logical state of the particular one communication signal supplied to an input terminal thereof, and which is configured to feed back a logical output of the flip-flop to the input terminal in place of the particular one communication signal;
a preset-type flip-flop circuit which includes a plurality of stages of flip-flops more than the reset-type flip-flop circuit, wherein the plurality of stages of flip-flops include a flip-flop of a first stage which is configured to operate in synchronism with the internal clock to be preset to a low level after the release of the reset operation, and a flip-flop of a succeeding stage which is configured to operate in synchronism with the internal clock and in which a logical output of the flip-flop of a preceding stage is set; and
an OR circuit which is configured to output a logical output of the preset-type flip-flop circuit or a logical output of the reset-type flip-flop circuit as the operation mode output value for determining the operation mode of the circuit device main body.

21. The integrated circuit device according to claim 16, wherein
the operation mode determination circuit is configured to set the normal mode by fixing the external input port to a low level in a case where the normal mode of the circuit device main body is not accompanied by the data communication with the external control device, and
the operation mode determination circuit is configured to fix the external input port to a high level at a time of setting the debug mode.

22. The integrated circuit device according to claim 16, wherein the circuit device main body is configured to set the execution condition of the predetermined processing function in the normal mode of the circuit device main body according to information obtained from the data communication with the external control device when the debug mode is set.

* * * * *